(12) United States Patent
Chatterjee

(10) Patent No.: US 12,176,853 B2
(45) Date of Patent: *Dec. 24, 2024

(54) INTEGRATED CIRCUIT DEVICES WITH PARALLEL POWER AMPLIFIER OUTPUT PATHS

(71) Applicant: TEXAS INSTRUMENTS INCORPORATED, Dallas, TX (US)

(72) Inventor: Rohit Chatterjee, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/334,527

(22) Filed: May 28, 2021

(65) Prior Publication Data

US 2021/0288613 A1 Sep. 16, 2021

Related U.S. Application Data

(63) Continuation of application No. 16/564,881, filed on Sep. 9, 2019, now Pat. No. 11,050,387.

(51) Int. Cl.
| | |
|---|---|
| *H03F 1/02* | (2006.01) |
| *H03F 3/213* | (2006.01) |
| *H03F 3/45* | (2006.01) |
| *H03H 7/38* | (2006.01) |
| *H03K 17/56* | (2006.01) |

(52) U.S. Cl.
CPC .......... *H03F 1/0211* (2013.01); *H03F 3/213* (2013.01); *H03F 3/45071* (2013.01); *H03H 7/38* (2013.01); *H03K 17/56* (2013.01)

(58) Field of Classification Search
CPC ... H03F 1/301; H03F 3/19; H03F 3/72; H03F 2200/372; H03G 1/0088
USPC ........................................................ 327/560
See application file for complete search history.

(56) References Cited

U.S. PATENT DOCUMENTS

| | | |
|---|---|---|
| 7,248,845 B2 | 7/2007 | Dunn |
| 9,755,594 B1 | 9/2017 | Wu et al. |
| 2001/0029168 A1 | 10/2001 | Yamaguchi |
| 2002/0019219 A1* | 2/2002 | Doherty ................... H03F 1/02 455/127.1 |
| 2005/0026573 A1 | 2/2005 | Cho |
| 2009/0323567 A1 | 12/2009 | Chao et al. |

(Continued)

*Primary Examiner* — Quan Tra
(74) *Attorney, Agent, or Firm* — Michael T. Gabrik; Frank D. Cimino

(57) ABSTRACT

An integrated circuit device is provided. In some examples, the integrated circuit device includes a first amplifier path, a second amplifier path coupled in parallel with the first amplifier path, a matching network coupled to the first amplifier path and the second amplifier path, and an antenna coupled to the matching network. In some such examples, the first amplifier path includes a first differential power amplifier coupled to the matching network, and the second amplifier path includes a second differential power amplifier coupled to the matching network. The integrated circuit device may further include a controller coupled to selectively enable the first amplifier path to provide a transmitter output power within a first range and to selectively enable the second amplifier path to provide a transmitter output power within a second range that is different from the first range.

20 Claims, 2 Drawing Sheets

(56) References Cited

U.S. PATENT DOCUMENTS

| | | | |
|---|---|---|---|
| 2012/0013387 A1* | 1/2012 | Sankaranarayanan | ..................... H03D 7/165 327/355 |
| 2012/0075016 A1* | 3/2012 | Visser | ................. H04B 1/0458 330/144 |
| 2014/0097698 A1 | 4/2014 | Wang et al. | |
| 2014/0139034 A1 | 5/2014 | Sankar et al. | |
| 2014/0354350 A1* | 12/2014 | Bowers | .................. H03F 3/195 327/564 |
| 2015/0050901 A1* | 2/2015 | Lee | ...................... H03F 1/0277 455/127.3 |
| 2015/0194944 A1* | 7/2015 | Joshi | ........................ H03H 7/38 327/551 |
| 2017/0126185 A1* | 5/2017 | Kang | ................. H03F 3/45179 |
| 2018/0097531 A1* | 4/2018 | Kummaraguntla | .. H04B 1/0483 |
| 2018/0351517 A1* | 12/2018 | Chen | ................... H03F 3/45475 |
| 2019/0207799 A1* | 7/2019 | Luo | ...................... H04L 27/368 |

* cited by examiner

INTEGRATED CIRCUIT DEVICES WITH PARALLEL POWER AMPLIFIER OUTPUT PATHS

CROSS-REFERENCE TO RELATED APPLICATIONS

This application is a continuation of U.S. patent application Ser. No. 16/564,881 filed Sep. 9, 2019, the entire content of which is hereby incorporated by reference.

BACKGROUND

A transmitter of a wireless communications device may include amplifier circuitry that receives a signal to be transmitted and amplifies the signal for transmission. In many such devices, the transmitter circuitry may consume a significant portion of the total power, and the amplifier circuitry within the transmitter may be one of the primary contributors. Accordingly, in battery-powered applications, the power consumption and efficiency of the amplifier circuitry may have a notable impact on battery life.

In some example devices that utilize power amplifier circuitry, the power amplifier circuitry operates most efficiently when the power amplifier is at saturation. However, to avoid harmful interference, a transmitter may be instructed to reduce its output power when possible. The reduced output power remains sufficient for communication with a receiver while minimizing interference inflicted on other devices. The transmitter's output power may be reduced by reducing bias current of the power amplifier so that the power amplifier operates in a current saturated mode. However, in the current saturated mode, the efficiency of the amplifier circuitry may fall as the bias current is reduced. This may be particularly pronounced at large reductions (e.g., back off) in output power. In addition to inefficiency, variability in the amplifier's output power due to process variations in the active circuitry may increase as the bias current is reduced.

SUMMARY

In some examples, an integrated circuit is provided that includes amplifier circuitry for a wireless transmitter. The transmitter operates within a given transmitter output power range. The amplifier circuitry includes a first amplifier path configured to transmit at a first (e.g., upper) portion of the output power range and a second amplifier path coupled in parallel and configured to transmit at a second (e.g., lower) portion of the power range. The first amplifier path is configured to operate most efficiently in the first portion of the power range, while the second amplifier path is configured to operate most efficiently in the second portion. Both paths may include differential power amplifiers, and both are coupled to a matching network that includes a set of switches that reconfigure the matching network depending on which amplifier path is enabled.

In some examples, an integrated circuit device includes: a first amplifier path, a second amplifier path coupled in parallel with the first amplifier path, a matching network coupled to the first amplifier path and the second amplifier path, and an antenna coupled to the matching network. In some such examples, the first amplifier path includes a first differential power amplifier coupled to the matching network, and the second amplifier path includes a second differential power amplifier coupled to the matching network. In some such examples, the second amplifier path further includes a third differential power amplifier coupled to a differential input of the second differential power amplifier. In some such examples, the integrated circuit device further includes a controller coupled to control the first amplifier path, the second amplifier path, and the matching network. In some such examples, the controller is configured to selectively enable the first amplifier path to provide a transmitter output power within a first range, and selectively enable the second amplifier path to provide a transmitter output power within a second range that is less than the first range. In some such examples, the matching network includes a switch, and the controller is configured to set a state of the switch based on which of the first amplifier path and the second amplifier path is selectively enabled. In some such examples, the integrated circuit device further includes a driver element coupled to provide an input signal to each of the first amplifier path and the second amplifier path. In some such examples, the second amplifier path includes a first stage power amplifier coupled to receive the input signal from the driver element and to produce a second signal in response to the input signal, and a second stage power amplifier coupled to receive the second signal from the first stage power amplifier and to produce a third signal in response to the second signal. In some such examples, the matching network includes: a balun coupled to the first amplifier path, a first capacitor coupled in parallel with the balun, and a second capacitor coupled in parallel with the first capacitor. The second stage power amplifier includes a first differential output coupled to the balun and a second differential output coupled to the second capacitor. In some such examples, the matching network further includes: a first switch coupled to the balun, a second switch coupled to the first capacitor, and a third switch coupled to the second capacitor.

In further examples, an integrated circuit includes: a first power amplifier, a second power amplifier coupled in parallel with the first power amplifier, a matching network coupled to the first power amplifier and the second power amplifier that includes a set of switches, and a controller coupled to control the first power amplifier, the second power amplifier, and the set of switches. The controller is configured to selectively enable one of the first power amplifier and the second power amplifier based on a specified output power.

In yet further examples, an integrated circuit includes a processing resource, and a non-transitory computer-readable medium coupled to the processing resource. The computer-readable medium stores instructions that, when executed by the processing resource, cause the processing resource to determine a transmitter output power, selectively enable one of a first amplifier path and a second amplifier path based on the determined transmitter output power, and cause the selected one of the first amplifier path and the second amplifier path to transmit a signal in accordance with the determined transmitter output power.

BRIEF DESCRIPTION OF THE DRAWINGS

Features of the present invention may be understood from the following detailed description and the accompanying drawings. In that regard.

DETAILED DESCRIPTION

Figure 1:
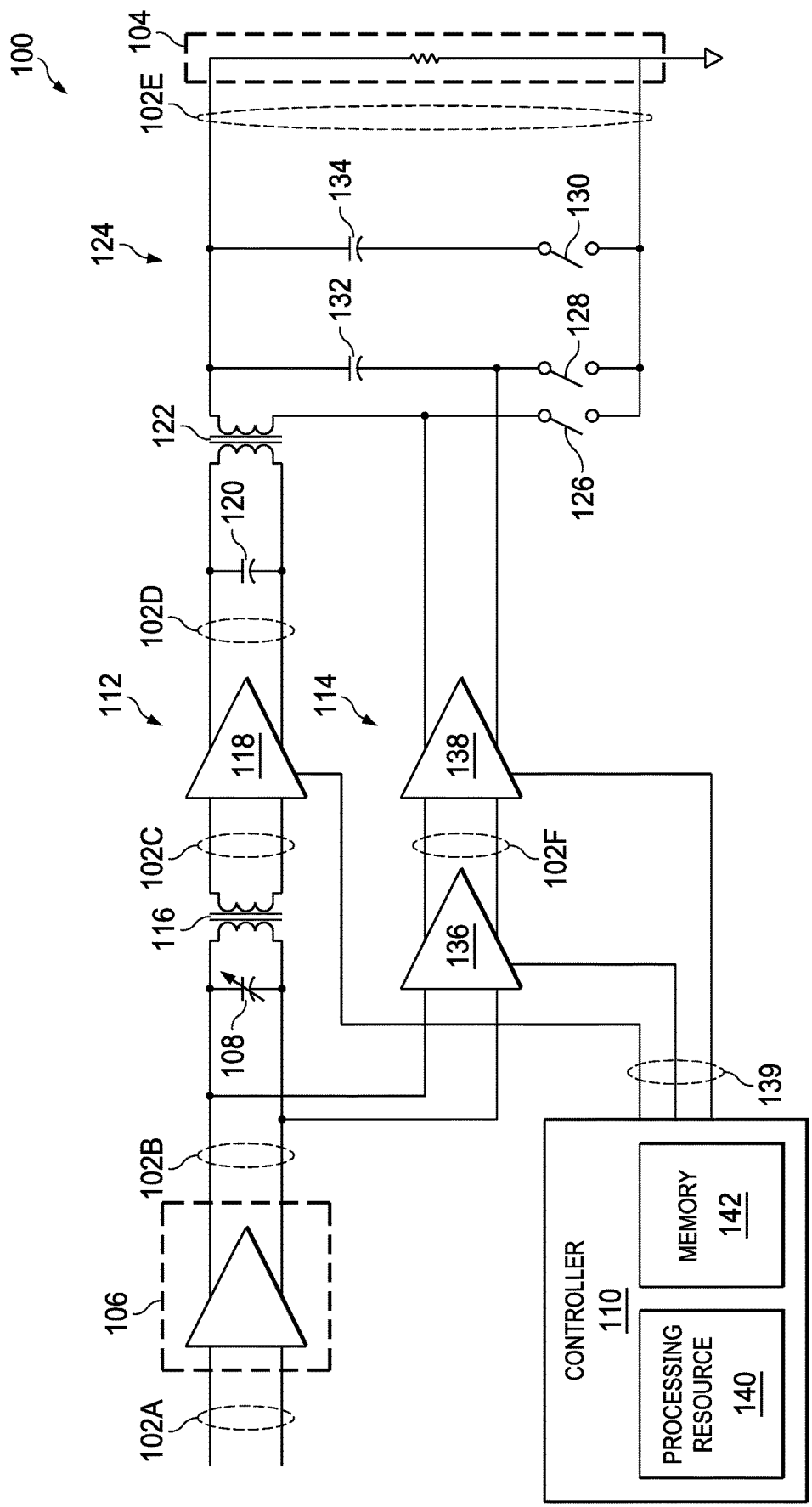
FIG. 1 is a circuit diagram of an integrated circuit device according to some aspects of the present disclosure.

Specific examples are described below in detail with reference to the accompanying figures. It is understood that these examples are not intended to be limiting, and unless otherwise noted, no feature is required for any particular example. Moreover, a first device that is coupled or connected (electrically, physically, or otherwise) to a second device may be coupled or connected directly without any intervening device or indirectly through one or more intervening devices.

A number of wireless communication standards call for a wireless transmitter to dynamically adjust its output power in order to reduce interference inflicted upon other devices sharing the same channel or adjacent channels. This may also reduce power consumption by the transmitting device. As an example of one such standard, IEEE 802.11ax specifies that the transmitter output power be within a defined range and specifies that the output power be reduced when possible.

However, many power amplifier circuits have their greatest efficiency at or near saturation and have notably lower efficiency as output power is reduced. Accordingly, some examples of the present disclosure provide parallel power amplifier paths. A first path may be enabled when the specified transmitter output power is in an upper portion of the power range. The first path may be configured so that the power amplifier(s) of the first path are at saturation at or near the maximum output power specified by the power range. When the specified transmitter output power is in the upper portion of the power range, the output power may be controlled by adjusting the bias current of the power amplifier(s) of the first path. However, dividing the power range into upper portion and lower portions avoids the inefficiency involved with reducing the bias current enough to meet the lower portion of the power range.

Instead, the second path may be enabled when the specified transmitter output power is in the lower portion of the power range. The second path may be configured so that its power amplifier(s) are at saturation at or near the boundary (e.g., crossover) between the two portions of the power range. Using the second, lower power, amplifier path may provide a significant increase in efficiency compared to reducing the bias current of the power amplifier(s) of the first path to bring the transmitter output power down into the lower portion of the power range. Furthermore, in some examples, the power amplifiers of the second path operate at a lower supply voltage than the power amplifiers of the first path to further improve efficiency. Accordingly, in some such examples, the efficiency of the second path is about 2 to about 2.5 times greater than that of the first path if it were used to drive the lower portion of the power range.

In some examples, because the power amplifiers of the first path and the second path operate close to saturation, process-related variation characteristic of lower power operation is reduced. This may avoid process-dependent calibration of the transmitter.

A matching network coupled to the first and second paths may be reconfigured via switches depending on which path is enabled. In some examples, because the second path uses smaller devices and uses the same matching network, the area impact is minimal. In some examples, the matching network is configured to support differential power amplifiers in the second path, which provide greater power at saturation than comparable single-ended power amplifiers. Use of differential power amplifiers may also reduce higher order even harmonics, thereby improving linearity of the transmitted signal.

Of course, these advantages are merely examples, and no advantage is required for any particular embodiment.

Examples of an amplifier integrated circuit device are described with reference to the figures below. In that regard, FIG. 1 is a circuit diagram of the integrated circuit device 100 according to some aspects of the present disclosure.

The integrated circuit device 100 may be part of a wireless transmitter and receives an input signal 102A to be transmitted wirelessly via an antenna 104. In various such examples, the signal 102A is received by a driver element 106 of the integrated circuit device 100. The driver element 106 may include one or more frequency mixers, amplifiers, pre-amplifiers, filters, pre-distortion drivers, and/or other suitable signal processing components to condition the signal 102A for transmission. After conditioning, the driver element 106 may provide the signal 102A as conditioned signal 102B. The signals 102A and 102B may be differential signals and/or single-ended signals, and the driver element 106 may be a differential driver element and/or a single-ended driver element.

In a differential example, a variable capacitor 108 is coupled between the differential outputs of the driver element 106 that provide the conditioned signal 102B. A controller 110 may adjust the capacitance of the variable capacitor 108 to tune the gain of the integrated circuit device 100 based on the carrier frequency of the conditioned signal 102B. Specifically, the integrated circuit device 100 may be configured to transmit conditioned signals 102B that fall within one or more frequency bands designated for wireless communication (e.g., 2.4 GHz embodiments, 5 GHz embodiments, etc.). The frequency band(s) may be further subdivided into one or more channels, and the capacitance of the variable capacitor 108 may be set based on the channel and band the conditioned signal 102B is to be transmitted on.

The driver element 106 may provide the conditioned signal 102B to one of two different and independent power amplifier paths. In some examples, the integrated circuit device 100 includes a first power amplifier path 112 that is enabled and used when the desired transmitter output power is above a threshold (e.g., within an upper portion of an output power range). In some such examples, the integrated circuit device 100 further includes a second power amplifier path 114 coupled in parallel with the first power amplifier path 112 that is enabled and used when the desired transmitter output power is below the threshold (e.g., within a lower portion of the output power range).

Turning to the first power amplifier path 112, the integrated circuit device 100 may include a transformer 116 or other coupling circuit having inputs coupled to the differential output of the driver element 106. The variable capacitor 108 may be coupled between the inputs of the transformer 116. The transformer 116 may include a first set of coils electrically coupled to the inputs that receives the conditioned signal 102B and a second set of coils inductively coupled to the first set that produces a third signal 102C in response to the conditioned signal 102B.

The second set of coils of the transformer 116 may be coupled to an input (e.g., a differential pair of inputs) of a main power amplifier 118 to provide the third signal 102C to the main power amplifier 118. The main power amplifier 118 amplifies the third signal 102C to produce a fourth signal 102D for transmission. The main power amplifier 118 may be a differential amplifier and/or a single-ended amplifier, and in a differential example, a capacitor 120 and/or a balun 122 (e.g., a transformer) are coupled in parallel between the outputs of the main power amplifier that produce the fourth signal 102D.

The balun 122 may couple the main power amplifier 118 to a matching network 124. Similar to transformer 116, the balun 122 may include a first coil that receives the fourth signal 102D and a second coil that is inductively coupled to the first coil to produce a fifth signal 102E in response to the fourth signal 102D. The second coil of the balun 122 is coupled to one or more parallel capacitors (e.g., capacitor 132 and capacitor 134) of the matching network 124 and to an antenna 104 for wirelessly transmitting the fifth signal 102E.

As explained above, the first power amplifier path 112 may be used when the transmitter output power is within a given range. In more detail, the controller 110 determines the specified transmitter output power and, when the controller 110 determines that the transmitter output power falls within an upper portion of a power range, enters a first mode. The controller 110 may make these determinations based on any suitable signal internal or external to the integrated circuit 100. In some examples, the controller 110 determines the specified transmitter output power based on a signal strength indicator provided by a receiving device.

In the first mode where the transmitter output power falls within the upper portion of the power range, the controller 110 enables the main power amplifier 118 by sending an enable signal over a respective control line 139 and closes a set of switches in the matching network 124. The switches may include a first switch 126 coupled between the second coil of the balun 122 and a first terminal of the antenna 104, a second switch 128 coupled between the first capacitor 132 of the matching network 124 and the first terminal of the antenna 104, and a third switch 130 coupled between the second capacitor 134 of the matching network 124 and the first terminal of the antenna 104. The exact subset of switches 126-130 that are closed may vary based on the channel frequency. For example, switches 126-130 may all be closed for a first channel frequency, while switches 126 and 128 may be closed and switch 130 may be open for a second channel frequency. In some examples, at least switches 126 and 128 may be closed when operating in the first mode. Accordingly, in the first mode, the main power amplifier 118 sees the second coil of the balun 122 in parallel with first capacitor 132 and, in some examples, the second capacitor 134.

In the first mode, the controller may also disable power amplifiers 136 and 138 of the second power amplifier path 114 using the set of control lines 139, described in more detail below. The first terminal of the antenna 104 may be further coupled to ground, and in examples where switches 126 and 128 are closed in the first mode, this may act to ground the outputs of the final amplifier of the second power amplifier path 114.

The controller 110 may select the first mode based on the transmitter output power of the integrated circuit device 100 being within the upper portion of the power range (e.g., between about 5 dBm and about 20 dBm). Accordingly, the main power amplifier 118, which is enabled in the first mode, and the matching network 124 may be optimized for efficiency within this portion of the range.

However, it has been determined that in some examples, as the controller 110 reduces the transmitter output power produced by the main power amplifier 118, the main power amplifier 118 may become notably less efficient. For example, the controller 110 may reduce a bias current of the main power amplifier 118 to reduce the transmitter output power. However, the reduced bias current moves the main power amplifier 118 further away from the saturated mode of operation, where efficiency is highest.

Moreover, reducing the transmitter output power by reducing the bias current may cause the main power amplifier 118 to operate in a linear mode that may be both inefficient and overly sensitive to conditions of the integrated circuit device 100. Small variations in process conditions may cause performance of elements of the integrated circuit device 100, such as the drive strength of the transistors that make up the power amplifier 118 to vary between instances of the integrated circuit device 100. In turn, these drive strength and other process variations significantly affect amplifier gain, which leads to variations in the transmitter output power across devices 100. These design issues and others may be alleviated by the use of the second power amplifier path 114 when the specified transmitter output power is within the lower portion of the power range so that the main power amplifier 118 avoids significant excursions into the linear mode.

Turning now to the second power amplifier path 114, this path may include one or more power amplifier stages based on desired voltage gain and other design considerations. Accordingly, in a two-stage example, the second power amplifier path 114 includes a first stage power amplifier 136 coupled to the differential output of the driver element 106 in parallel with the variable capacitor 108. The first stage power amplifier 136 receives the conditioned signal 102B from the driver element and produces a sixth signal 102F in response to the conditioned signal 102B. The first stage power amplifier 136 may be configured to provide the bulk of the voltage gain and to isolate the driver element 106 from subsequent stages. Although two are shown, further examples include other numbers of power amplifier stages.

In the two-stage example, the second power amplifier path 114 includes a second stage power amplifier 138 coupled to the first stage power amplifier 136. The second stage power amplifier 138 receives the sixth signal 102F from the first stage power amplifier 136 and, when enabled, provides the fifth signal 102E to the matching network 124 in response to the sixth signal 102F.

The first stage and second stage power amplifiers 136 and 138 may be differential or single-ended. In some examples, differential-mode first stage and second stage power amplifiers 136 and 138 provide greater efficiency and increased power at saturation than comparable single-ended amplifiers. In some examples, differential-mode first stage and second stage power amplifiers 136 and 138 exhibit reduced harmonics (e.g., second-order and greater even order harmonics) in their outputs compared to single-ended amplifiers.

In differential example, a first differential output of the second stage power amplifier 138 is coupled to the first terminal of the antenna 104 by the first switch 126 and is further coupled to the second coil of the balun 122 and thereby coupled to a second terminal of the antenna 104. A second differential output of the second stage power amplifier 138 is coupled to the first terminal of the antenna 104 by the second switch 128, and is coupled to a capacitor (e.g., capacitor 132) that is, in turn, coupled to the second terminal of the antenna 104.

The second power amplifier path 114 may be used in a second mode of operation where the transmitter output power is to be within a lower portion (e.g., between about −10 dBm and about 5 dBm) of the output power range. The controller 110 may determine that the output power is to fall within this lower range based on any suitable signal internal or external to the integrated circuit 100. In the second mode, the controller 110 enables the power amplifiers 136 and 138 of the second power amplifier path 114 by supplying enable signals on respective control lines 139 and also opens some or all of the set of switches 126-130 in the matching network 124. In some examples, at least switches 126 and 128 are opened when operating in the second mode. The controller may also disable the main power amplifier 118 using the control lines 139.

The second power amplifier path 114 may be configured to provide a lower output power than the first power amplifier path 112, and accordingly, the power amplifiers 136 and 138 of the second power amplifier path 114 may be configured differently than the main power amplifier 118. In particular, the power amplifiers 136 and 138 of the second power amplifier path 114 may be optimized for efficiency within this range. In some such examples, the power amplifiers 136 and 138 of the second power amplifier path 114 operate at a lower supply voltage than the main power amplifier 118 (e.g., about 1.2 V compared to about 3 V). In some such examples, components, including transistors, of the power amplifiers 136 and 138 of the second power amplifier path 114 are smaller than their counterparts in the main power amplifier 118. In this way and others, the power amplifiers 136 and 138 of the second power amplifier path 114 may be biased to operate more efficiently at the lower portion of the transmitter output power range. In some such examples, the power amplifiers 136 and 138 of the second power amplifier path 114 are biased to operate in a saturated mode at or near the upper bound of this lower output power range portion. For example, if the threshold is about 5 dBm, such that the controller 110 enables the first power amplifier path 112 for transmitter output power above 5 dBm and the second power amplifier path 114 for output power below about 5 dBm, the amplifiers 136 and 138 of the second power amplifier path 114 may be biased to operate in a saturated mode at or near 5 dBm.

Figure 2:
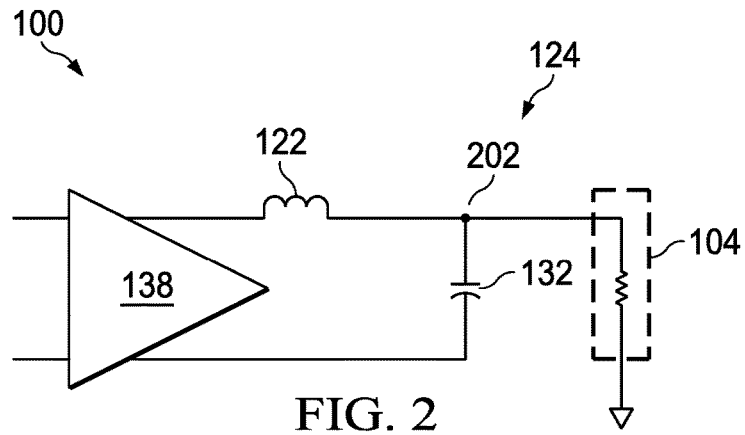
FIG. 2 is a circuit diagram of a portion of an integrated circuit device in a mode of operation according to some aspects of the present disclosure.

Operation of the second power amplifier path 114 in the second mode is further described with reference to FIG. 2. FIG. 2 is a circuit diagram of a portion of the integrated circuit device 100 in the second mode of operation according to some aspects of the present disclosure. Specifically, FIG. 2 illustrates the second stage power amplifier 136, the balun 122, the antenna 104, and the first capacitor 132 of the matching network 124.

As noted above, some or all of the switches 126-130 may be open in the second mode. Accordingly, in some examples, the matching network 124 in this mode may be modeled as the second coil of the balun 122 coupled between a first differential output of the second stage power amplifier 138 and a node 202. The capacitor 132 is effectively coupled between a second differential output of the second stage power amplifier 138 and the node 202, and the antenna 104 is coupled between the node 202 and ground. In this model, the voltage at the node 202 can be determined by the equation:

$$v_0 = v \frac{(Y_1 - Y_2)}{G_L + (Y_1 + Y_2)}$$

where, $v_0$ represents the voltage at the node 202, v represents the single ended voltage output by the second stage power amplifier 138, $Y_1$ represents the reciprocal (1/X) of the impedance of the second coil of the balun 122, $Y_2$ represents the reciprocal of the impedance of the capacitor 132, and $G_L$ represents the reciprocal of the impedance of the antenna 104.

In some examples, maximum power transfer occurs when $Y_1 = -Y_2$, which happens at the resonant frequency of the matching network 124. However, in some examples, because the matching network is a low-Q network, the power and efficiency of the second power amplifier path 114 is not adversely impacted even if there is some deviation between the resonant frequency of the matching network 124 and the carrier frequency of the conditioned signal 102B.

Figure 3:
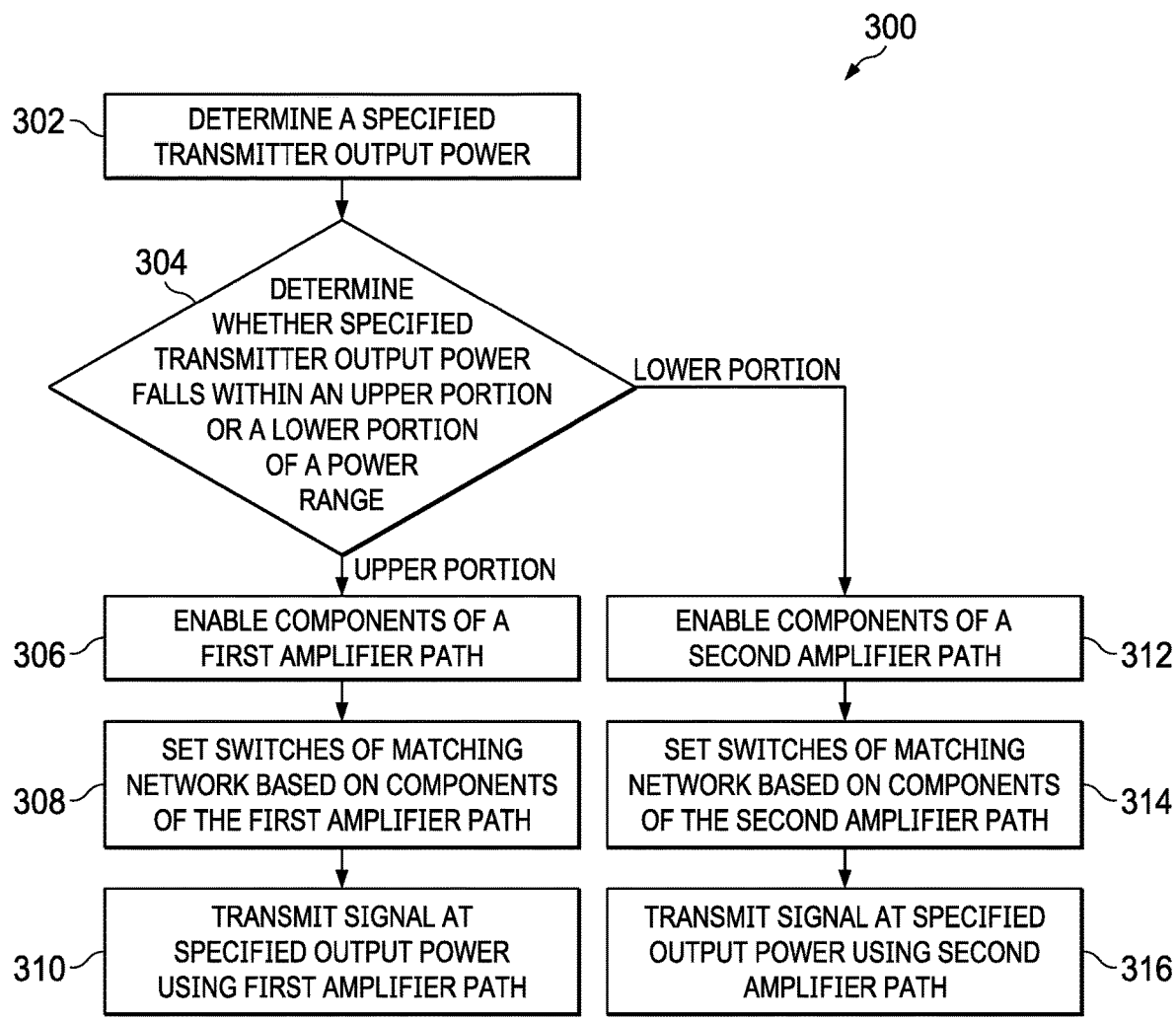
FIG. 3 is a flow diagram of a method of operating a wireless transmitter according to some aspects of the present disclosure.

Operation of the controller 110 is further described in the context of FIGS. 1 and 3. FIG. 3 is a flow diagram of a method 300 of operating a wireless transmitter according to some aspects of the present disclosure. Some processes of the method 300 may be performed in orders other than described, and many processes may be performed concurrently in parallel. Furthermore, processes of the method 300 may be omitted or substituted in some examples of the present disclosure. The method 300 is suitable for performing by a controller 110 or some other integrated circuit device.

The controller 110 or other integrated circuit device may perform the processes of the method 300 using any combination of dedicated hardware and instructions stored in a non-transitory medium. Accordingly, the controller 110 may include a processing resource 140 coupled to a non-transitory computer-readable medium 142. The processing resource 140 may include one or more microcontrollers, ASICs, CPUs, GPUs, and/or other processing resources configured to execute instructions stored on the medium 142. Examples of suitable non-transitory computer-readable media 142 include one or more flash memory devices, battery-backed RAM, SSDs, HDDs, optical media, and/or other memory devices suitable for storing the instructions for the processing resource 140.

Referring to block 302, the controller 110 determines a specified transmitter output power. The transmitter output power may be determined based on a wireless communication protocol or specification and/or on any suitable signal internal or external to the integrated circuit 100. In some examples, the controller 110 determines the specified transmitter output power based on a signal strength indicator provided by a receiving device and selects the transmitter output power to allow communication while minimizing interference.

Referring to block 304, the controller 110 determines whether the specified transmitter output power falls within an upper portion or a lower portion of a power range. This may include determining whether the specified transmitter output power meets or exceeds a power threshold.

Referring to block 306, when the controller 110 determines that the specified output power falls within the upper portion of the power range, the controller enables components of a first power amplifier path 112, such as a main power amplifier 118. This may include disabling components of a second power amplifier path 114 that is coupled in parallel with the first power amplifier path 112. Referring to block 308, the controller 110 sets states of switches 126-130 of a matching network 124 (e.g., closes switches 126-130) to optimize the frequency response of the matching network 124 based on operational parameters of the main power amplifier 118, a carrier frequency of a signal to be transmitted, and/or other suitable considerations.

Referring to block 310, the first power amplifier path 112 is used to transmit a signal at the specified transmitter output power via the antenna 104.

In contrast, when the controller 110 determines that the specified output power falls within the lower portion of the power range in block 304, the method 300 continues to block 312 where the controller enables components of the second power amplifier path 114 such as a first stage power amplifier 136 and a second stage power amplifier 138. This may include disabling components of the first power amplifier path 112. Referring to block 314, the controller 110 sets states of switches 126-130 of a matching network 124 (e.g., opens switches 126-130) to optimize the frequency response of the matching network 124 based on operational parameters of the first stage power amplifier 136, parameters of the second stage power amplifier 138, a carrier frequency of a signal to be transmitted, and/or other suitable considerations.

Referring to block 316, the first power amplifier path 112 is used to transmit a signal at the specified transmitter output power via the antenna 104.

It is understood that the present disclosure provides a number of exemplary embodiments and that modification are possible to these embodiments. Such modifications are expressly within the scope of this disclosure. Furthermore, application of these teachings to other environments, applications, and/or purposes is consistent with and contemplated by the present disclosure.

What is claimed is:

1. A circuit comprising:
   a first amplifier path;
   a second amplifier path having first and second outputs;
   a balun including first and second coils, the first coil coupled to the first amplifier path and the second coil coupled to the first and second outputs of the second amplifier path;
   a matching network coupled to the balun, the matching network comprising:
   first and second capacitors;
   a first switch with a first terminal and a second terminal, the first terminal of the first switch coupled to a first terminal of the second coil of the balun and to the first output of the second amplifier path, the second terminal of the first switch coupled to a common node;
   a second switch with a first terminal and a second terminal, the first terminal of the second switch coupled to a second terminal of the second coil of the balun via the first capacitor and coupled to the second output of the second amplifier path, the second terminal of the second switch coupled to the common node; and
   a third switch with a first terminal and a second terminal, the first terminal of the third switch coupled to the second terminal of the second coil of the balun via the second capacitor and coupled to the first terminal of the second switch via the first and second capacitors, the second terminal of the third switch coupled to the common node; and
   a controller coupled to the first and second amplifier paths.

2. The circuit of claim 1, wherein:
   the first amplifier path includes a first differential amplifier coupled to the first coil of the balun; and
   the second amplifier path includes a second differential amplifier having the first and second outputs which are coupled to the second coil of the balun and the matching network respectively.

3. The circuit of claim 2, wherein the second amplifier path further includes a third differential amplifier coupled to a differential input of the second differential amplifier.

4. The circuit of claim 3, wherein:
   the controller is configured to enable the first differential amplifier, and the controller is configured to disable the second differential amplifier and the third differential amplifier when the first differential amplifier is enabled.

5. The circuit of claim 4, wherein:
   the second differential amplifier generates a first voltage gain of a differential signal;
   the third differential amplifier generates a second voltage gain of the differential signal; and
   the first voltage gain is greater than the second voltage gain.

6. The circuit of claim 5, further comprising:
   a driver circuit configured to output the differential signal; and
   a variable capacitor coupled between a first output and a second output of the driver circuit.

7. The circuit of claim 6, wherein:
   the controller is configured to adjust the variable capacitor to tune a gain of the circuit.

8. The circuit of claim 1, wherein the first, second and third switches form a switching network.

9. The circuit of claim 1, wherein:
   the first and second capacitors are coupled in parallel.

10. The circuit of claim 1, wherein:
    the matching network is a low-Q network.

11. The circuit of claim 1, further comprising:
    an antenna coupled to the matching network.

12. An integrated circuit comprising:
    a processing resource;
    a first amplifier path;
    a second amplifier path having first and second outputs;
    a balun including first and second coils, the first coil coupled to the first amplifier path and the second coil coupled to the second amplifier path;
    a matching network configured for use with the first amplifier path and the second amplifier path, the matching network comprising:
    a capacitor having first and second ends, the first end coupled to a second terminal of the second coil of the balun;
    a first switch configured to couple a first terminal of the second coil of the balun and the first output of the second amplifier path to a common node when the first switch is closed;
    a second switch configured to couple the second end of the capacitor to the common node when the second switch is closed; and
    a third switch configured to couple the second terminal of the second coil of the balun to the common node when the third switch is closed; and
    a non-transitory computer-readable medium coupled to the processing resource and storing instructions that, when executed by the processing resource, cause the processing resource to:
    determine a transmitter output power;
    in response to the transmitter output power within a first range, close the first, second and third switches to enable the first amplifier path;
    in response to the transmitter output power within a second range, open the first, second and third switches to enable the second amplifier path; and
    cause the enabled amplifier path to transmit a signal in accordance with the transmitter output power.

13. The integrated circuit of claim 12, wherein:
the instructions include further instructions that cause the processing resource to control at least one of the first, second and third switches in the matching network based on the transmitter output power.

14. The integrated circuit of claim 13, wherein:
the first amplifier path includes a first differential power amplifier and a variable capacitor coupled to an input of the first differential power amplifier; and
the second amplifier path includes a second differential power amplifier.

15. The integrated circuit of claim 14, wherein:
the first coil of the balun is coupled to the first differential power amplifier;
the second coil of the balun is coupled to the second differential power amplifier; and
the matching network is configured to be coupled to an antenna.

16. The integrated circuit of claim 14, wherein:
the instructions include further instructions to control the variable capacitor to tune a gain of the integrated circuit.

17. The integrated circuit of claim 12, wherein:
the capacitor is a first capacitor; and
the matching network includes a second capacitor coupled between the second terminal of the second coil of the balun and the third switch.

18. The integrated circuit of claim 12, wherein:
the matching network includes an output coupled to the first terminal of the capacitor and to the second terminal of the second coil of the balun, the output of the matching network being configured to be coupled to an antenna.

19. The integrated circuit of claim 12, further comprising:
a driver circuit configured to output a differential signal; and
a variable capacitor coupled between a first output and a second output of the driver circuit.

20. The integrated circuit of claim 19, wherein: the instructions include further instructions that cause the processing resource to control the variable capacitor to tune a gain of the integrated circuit based on a carrier frequency of the differential signal.

* * * * *